(12) United States Patent
Bell et al.

(10) Patent No.: US 6,711,859 B2
(45) Date of Patent: Mar. 30, 2004

(54) SYSTEM AND METHOD FOR FIXING A FIRST COMPONENT WITH A SECOND COMPONENT

(76) Inventors: Michael Ray Bell, 2217 Ivan St., Apt. 1405, Dallas, TX (US) 75201; Kechuan Liu, 605 Snead Dr., Plano, TX (US) 75025

( * ) Notice: Subject to any disclaimer, the term of this patent is extended or adjusted under 35 U.S.C. 154(b) by 0 days.

(21) Appl. No.: 09/872,316

(22) Filed: Jun. 1, 2001

(65) Prior Publication Data

US 2002/0178657 A1 Dec. 5, 2002

(51) Int. Cl.[7] .............. E06B 3/00; B65D 6/28; A47G 29/00
(52) U.S. Cl. .......... 49/501; 312/265.6; 403/329; 220/4.02
(58) Field of Search .......... 49/501, 503, 394; 292/80, 81, 87; 312/263, 265.6, 294, 111; 403/326, 327, 329, 325; 220/3.8, 4.02, 324, 326, 788, 784, 345.2, 345.3, 351

(56) References Cited

U.S. PATENT DOCUMENTS

| | | | | |
|---|---|---|---|---|
| 3,420,399 A | * | 1/1969 | Heisler | 220/784 X |
| 3,851,435 A | * | 12/1974 | Roberts et al. | 403/245 |
| 5,348,356 A | * | 9/1994 | Moulton | 292/80 |
| 5,383,098 A | * | 1/1995 | Ma et al. | 220/4.02 X |
| 5,491,611 A | * | 2/1996 | Stewart et al. | 312/223.2 X |
| 5,718,492 A | * | 2/1998 | Ellison | 312/263 X |
| 5,743,606 A | * | 4/1998 | Scholder | 312/223.2 |
| 6,177,631 B1 | * | 1/2001 | Schindler | 220/3.8 X |
| 6,210,068 B1 | * | 4/2001 | Wei | 403/353 |
| 6,220,678 B1 | * | 4/2001 | Claprood et al. | 312/223.2 |
| 6,361,242 B1 | * | 3/2002 | Daoud | 403/329 |
| 6,367,896 B1 | * | 4/2002 | Peng et al. | 312/223.2 |
| 6,375,283 B1 | * | 4/2002 | Kitamura et al. | 312/223.1 X |

FOREIGN PATENT DOCUMENTS

| | | | | |
|---|---|---|---|---|
| GB | 2096116 | * | 10/1982 | 220/784 X |
| GB | 2104881 | * | 3/1983 | 220/784 |

* cited by examiner

Primary Examiner—Daniel P. Stodola
Assistant Examiner—Hugh B. Thompson
(74) Attorney, Agent, or Firm—Law Office of Donald D. Mondul

(57) ABSTRACT

A system for fixing two components together includes: (a) a boss integrally formed from one component about a boss axis; and (b) a latch integrally formed from the other component in a depending extension facilitating latch movement in an engaging plane and exerting a spring force urging the latch toward a first position. The latch is oriented about a latch axis in the engaging plane. The latch is in the first position when the components are situated in an initial position with the latch axis and the boss axis separated a first distance. The latch axis and the boss axis are separated a second distance less than the first distance when the components are urged together to an installed orientation with the latch held from the first position by the boss bearing against the latch with the engaging plane crossing the boss axis.

10 Claims, 9 Drawing Sheets

SYSTEM AND METHOD FOR FIXING A FIRST COMPONENT WITH A SECOND COMPONENT

BACKGROUND OF THE INVENTION

The present invention is directed to a system and method for fixing a first component with a second component. In its preferred embodiment the present invention is employed to effect assembly of an enclosure. The invention is particularly suitable for enclosures containing a product especially an electrical product.

The invention is a self-locking mechanism or arrangement for making parts for separable enclosures that can be advantageously formed as by stamping using no additional parts other than the blank sheet or sheets from which an enclosure is to be created.

Prior art enclosure structures employ additional parts such as self-clinching hardware that can be press-fitted into one of the pieces to be joined. Examples of such self-clinching hardware are captive PEM nuts and PEM studs provided by Penn Engineering Company. An alternative to such self-clinching hardware is to drill and tap an aperture for threaded engagement by a fastener during assembly of the enclosure. Rivets and loose hardware (e.g. screws and nuts) are still other closure structures encountered in prior art enclosures. Moreover some of the prior art closure structures (e.g. rivets) are difficult to remove so they are an impediment to access to enclosed equipment for service or repair. All such prior art enclosure fabrication techniques require additional materials (e.g. self-clinching nuts) or additional operations (e.g. drilling and tapping) that often create waste material that must be vacated from the finished product-enclosure. For example waste metal tendrils or chips created from drilling and tapping or from installation of some rivets must be eliminated from any enclosure that is to be employed for containing an electrical or electronic product to avoid risk of shorting. Such additional materials and additional operations add cost and complexity to fabrication costs for enclosures.

There is a need for an efficient system and method for enclosing a product that can be fabricated using no additional parts other than a blank sheet or sheets of raw material.

There is a need for a system and method for enclosing a product that is efficient in the operations required for its manufacture.

SUMMARY OF THE INVENTION

The invention is a system and method for fixing components of an enclosure that is self-sealing and can be formed using no additional materials other than a blank sheet or sheets. The enclosure is fabricated in at least two parts to establish the resulting enclosure as a separable and reclosable enclosure. The system is embodied in a separable enclosure fabricated of a first component and a second component. Preferably an extruded post or boss is formed with one component of the enclosure and a spring-acting flexible arm structure supporting a receiving slot or latch member is formed with the other component of the enclosure. The structures required for the inventive system can be fabricated in each component during a stamping operation without any need for additional material in the flat stamping pattern. That is there is no requirement for any additional parts hardware or fabrication operations beyond stamping and forming to create the components for the enclosure. The enclosure may be reopened and reclosed several times when fabricated of suitably robust material so long as the spring action incurred by flexible motion of the spring acting flexible arm supporting the latch member operates in the linear range of the material employed for fabricating the enclosure or so long as the stresses in the flexible arm structure do not exceed the yield stress of the material used for fabricating the enclosure when the material is formed to the required geometry.

Thus a system for substantially fixing a first component with a second component includes: (a) a boss member integrally formed from the first component and generally oriented about a boss axis; and (b) a latch member integrally formed from the second component and depending from the second component in a flexible extension. The flexible extension facilitates movement of the latch member generally in an engaging plane. The flexible extension exerts a spring force urging the latch member toward a first position when the latch member is displaced to a second position different from the first position. The spring force exerted by the flexible extension is generally proportional to the magnitude of the deflection experienced by the latch member when moved from the first position to the second position. The latch member is generally oriented about a latch axis in the engaging plane. The latch member is in the first position when the first component and the second component are substantially adjacently situated in an initial position poised for assembly. The latch axis and the boss axis are separated a first distance when the first component and the second component are in the initial position. The latch axis and the boss axis are separated a second distance less than the first distance when at least one of the boss member and the latch member is urged toward the other member of the boss member and the latch member to engage the boss member and the latch member in an installed orientation to establish the fixing with the latch member held in an installed position displaced from the first position by the boss member bearing against the latch member with the engaging plane crossing the boss axis.

A method for substantially fixing a first component with a second component includes the steps of: (a) providing a boss member integrally formed from the first component and generally oriented about a boss axis; the boss axis being generally perpendicular with the first component; (b) providing a latch member integrally formed from the second component and depending from the second component in a spring arm. The spring arm facilitates movement of the latch member generally in an engaging plane. The spring arm exerts a spring force urging the latch member toward a first position when the latch member is displaced to a second position different from the first position. The latch member is generally oriented about a latch axis in the engaging plane; (c) situating the first component and the second component substantially adjacent in an initial position poised for assembly with the engaging plane generally perpendicular with the boss axis; the latch axis and the boss axis being separated a first distance when the first component the second component are in the initial position; and (d) urging at least one of the boss member and the latch member toward the other member of the boss member and the latch member to engage the boss member and the latch member in an installed orientation. The latch axis and the boss axis are separated a second distance less than the first distance when the boss member and the latch member are engaged in the installed orientation to establish the fixing with the latch member held in an installed position displaced from the first position by the boss member bearing against the latch member with the engaging plane crossing the boss axis.

It is therefore an object of the present invention to provide a system and method for fixing a first component with a second component that can be fabricated using no additional parts than a blank sheet or sheets.

It is a further object of the present invention to provide a system and method for fixing a first component with a second component that is efficient in the operations required for its manufacture.

It is yet a further object of the present invention to provide a system and method for fixing a first component with a second component that is useful in fabricating an enclosure for a product.

Further objects and features of the present invention will be apparent from the following specification and claims when considered in connection with the accompanying drawings in which like elements are labeled using like reference numerals in the various figures illustrating the preferred embodiments of the invention.

DETAILED DESCRIPTION OF THE PREFERRED EMBODIMENT

Figure 1:
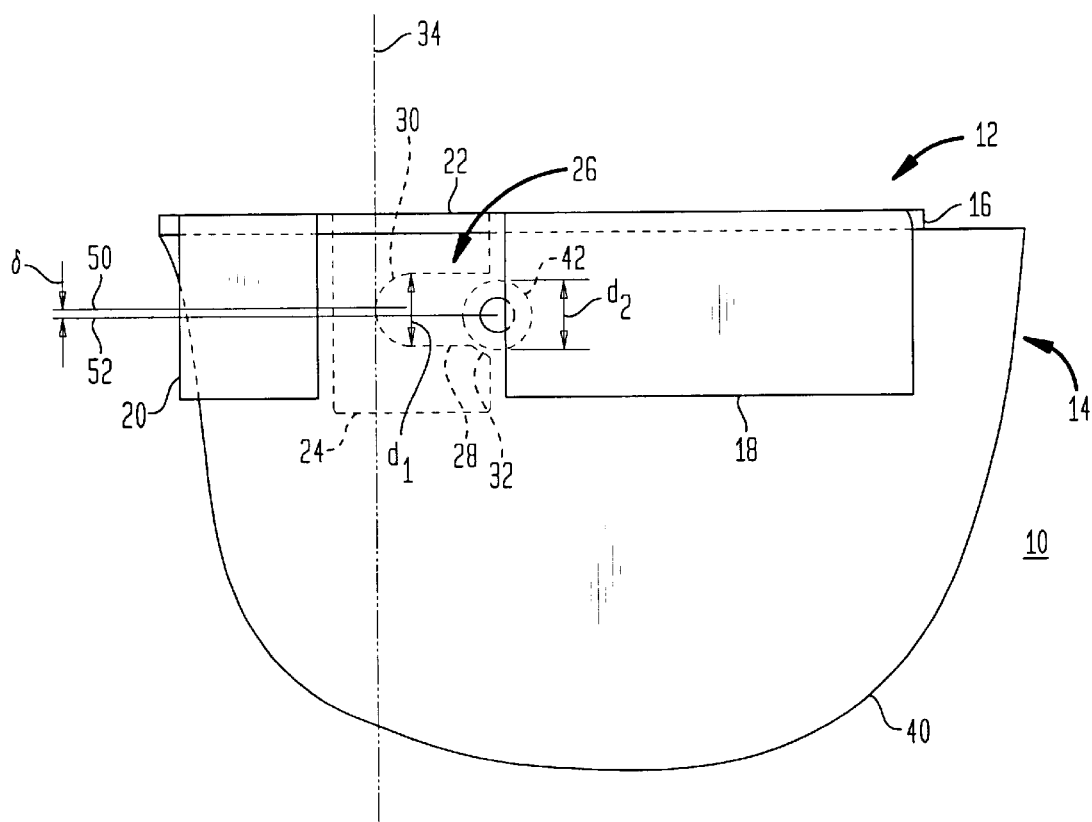
FIG. 1 is a front view of a first component and a second component in an initial position poised or assembly.

FIG. 1 is a front view of a first component and a second component in an initial position poised for assembly. In FIG. 1 a system 10 for fixing a first component 12 with a second component 14 is illustrated. First component 12 has a generally planar expanse 16 (viewed edge-on in FIG. 1) with depending skirt segments 18, 20. First component 12 further includes a spring arm 22 depending from planar expanse 16. Spring arm 22 terminates in a latch member 24. Latch member 24 is generally contained in an engaging plane (substantially parallel with the plane of FIG. 1) and presents an engagement structure 26. Engagement structure 26 includes a receiving rail 28 and a receiving bight 30.

Second component 14 includes a substantially planar expanse 40 that is preferably generally perpendicular with planar expanse 16 of first component 12. This substantially perpendicular arrangement of planar expanses 16, 40 is a preferred embodiment presented in FIG. 1 for illustrative purposes and is not intended as a limiting feature of the present invention. A protrusion or boss member 42 is formed in planar expanse 40. Boss member 42 extends from planar expanse 40 and is oriented about a boss axis (preferably perpendicular to the plane of FIG. 1).

First component 12 and second component 14 are illustrated in FIG. 1 in an initial position poised for assembly to an installed orientation. Thus planar expanse 40 is in substantially abutting relationship with planar expanse 16 substantially perpendicular with planar expanse 16 and lightly abutting with skirt segments 18, 20 with boss member 42 extending from planar expanse 40 in a direction away from skirt segments 18, 20. Substantially abutting indicates that two components are either in contact along nearly their entire facing portions or that two components are touching along some of their facing portions or there is a small gap between the two components along their facing portions. Engagement structure 26 is situated next to planar expanse 40 on the side of planar expanse 40 opposite from the side of planar expanse 40 against which skirt segments 18, 20 abut. Engagement structure 26 is in close spaced relation with boss member 42 and presents receiving rail 28 toward boss member 42.

In order to facilitate positioning boss member 42 on receiving rail 28 during assembly a transition structure preferably in the form of a ramp 32 is provided at receiving rail 28 distal from receiving bight 30. Preferably receiving bight 30 has a diameter $d_1$ at least slightly greater than the facing expanse of boss member 42. In the embodiment of boss member 42 illustrated in FIG. 1, boss member 42 is cylindrical in shape having an outside diameter $d_2$ and an inside diameter that is determined by the thickness of the material of planar expanse 40 and the diameter of the tool (such as a punch) used to extrude boss member 42 from planar expanse 40. Thus in the embodiment of the invention illustrated in FIG. 1, $d_1$ is preferably slightly greater than $d_2$. Providing such a slightly greater diameter $d_1$ permits easy insertion of boss member 42 within receiving bight 30 in a nestling relationship with receiving bight 30 when components 12, 14 are in an installed orientation as will be described in detail in connection with FIG. 3 and 4. Boss member 42 may be embodied in any rod-shaped configuration having but not limited to any polygonal cross section or elliptical cross-section taken perpendicular to boss axis 41. Receiving bight 30 is symmetrical about a receiving bight axis or datum 50; boss member 42 is symmetrical about a boss member axis or datum 52 (datum 52 intersects perpendicularly with the boss axis; better seen in FIG. 2). In the initial position of components 12, 14 poised for assembly illustrated in FIG. 1 receiving bight datum 50 and boss member datum 52 are separated by a distance δ and receiving bight is situated at a starting line 34.

Figure 2:
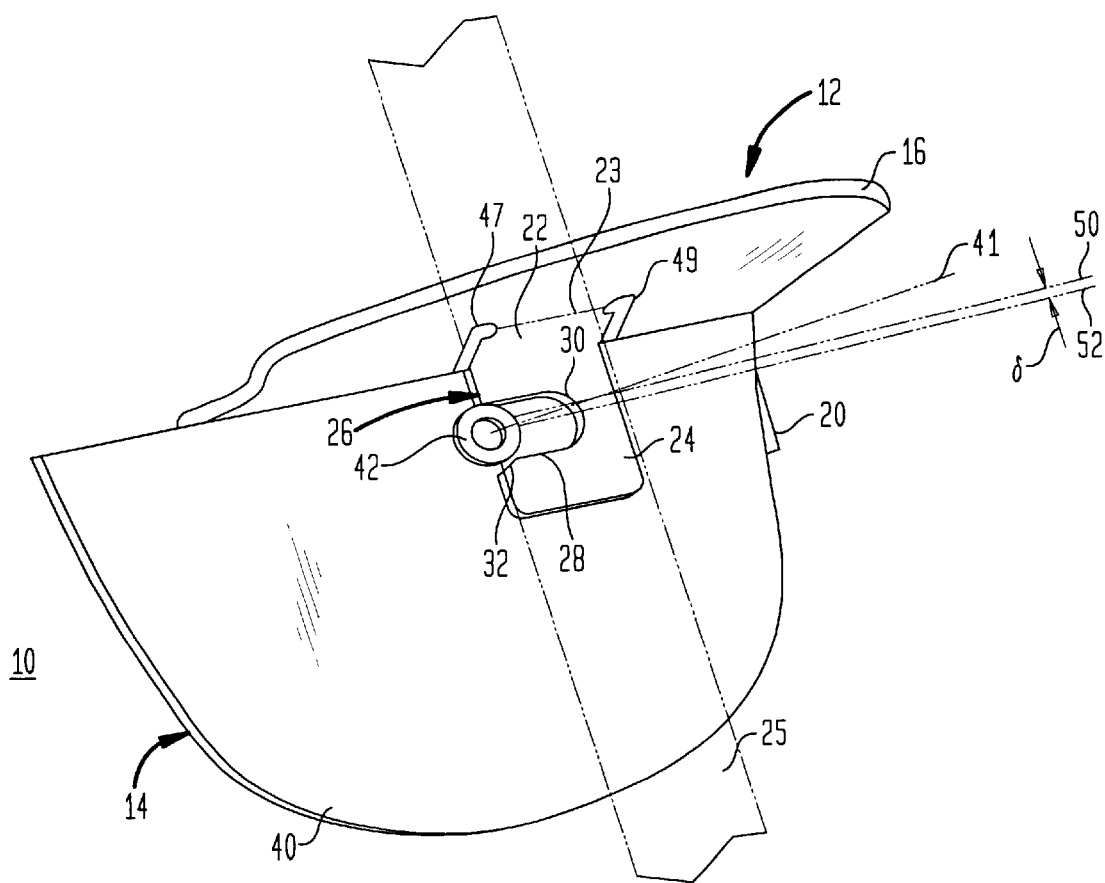
FIG. 2 is a perspective rear view of a first component and a second component in an initial position poised for assembly.

FIG. 2 is a perspective rear view of a first component and a second component in an initial position poised for assembly. In FIG. 2 system 10 for fixing a first component 12 with a second component 14 is illustrated with first component 12 having generally planar expanse 16 with depending skirt segment 20 (depending skirt 18 is not visible in FIG. 2). First component 12 further includes spring arm 22 depending from planar expanse 16. Displacement of spring arm 22 from its initial position to an installed position (FIGS. 4 and 5) is accomplished by bending of spring arm 22 about a bend axis 23 preferably located substantially where spring arm 22 depends from planar expanse 16. Bend relief structures 47, 49 may be provided to define the desired location of bend axis 23. Alternatively bend axis 23 may be located at any position along spring are 22 between the position indicated in FIG. 6 and engagement structure 26.

Spring arm 22 terminates in latch member 24. Latch member 24 is generally contained in an engaging plane 25, and presents an engagement structure 26 that includes receiving rail 28 and receiving bight 30.

Second component 14 includes substantially planar expanse 40 that is situated preferably generally perpendicular with planar expanse 16 of first component 12. This substantially perpendicular arrangement of planar expanses 16, 40 is a preferred embodiment presented in FIG. 2 for illustrative purposes and is not intended as a limiting feature of the present invention. Boss member 42 is formed in planar expanse 40 and extends from planar expanse 40 oriented about a boss axis 41.

First component 12 and second component 14 are illustrated in FIG. 2 in an initial position poised for assembly to an installed orientation. Thus planar expanse 40 is in substantially abutting relationship with planar expanse 16, substantially perpendicular with planar expanse 16, and lightly abutting with skirt segments 18, 20 with boss member 42 extending from planar expanse 40 in a direction away from skirt segments 18, 20 (skirt segment 18 is not visible in FIG. 2). Engagement structure 26 is situated next to planar expanse 40 on the side of planar expanse 40 opposite from the side of planar expanse 40 against which skirt segments 18, 20 abut. Engagement structure 26 is in close spaced relation with boss member 42 and presents receiving rail 28 toward boss member 42.

In order to facilitate positioning boss member 42 on receiving rail 28 during assembly a transition structure preferably in the form of a ramp 32 is provided at receiving rail 28 distal from receiving bight 30. Preferably receiving bight 30 has a diameter $d_1$ at least slightly greater than the facing expanse of boss member 42. In the embodiment of boss member 42 illustrated in FIG. 2, boss member 42 is cylindrical in shape having an outside diameter $d_2$ and an inside diameter that is determined by the tool used to extrude boss member 42 from planar expanse 40. Thus in the embodiment of the invention illustrated in FIGS. 1 and 2, $d_1$ is preferably slightly greater than $d_2$. Providing such a slightly greater diameter $d_1$ permits easy insertion of boss member 42 within receiving bight 30 in a nestling relationship with receiving bight 30 when components 12, 14 are in an installed orientation as will be described in detail in connection with FIG. 3 and 4. Boss member 42 may be embodied in any rod-shaped configuration having but not limited to any polygonal cross section or elliptical cross-section taken perpendicular to boss axis 41.

Receiving bight 30 may be fashioned in any shape that receives boss member 42 in a generally nestling relationship. Receiving bight 30 is preferably symmetrical about a receiving bight datum 50; boss member 42 is symmetrical about a boss member datum 52. Boss member datum 52 intersects perpendicularly with boss axis 41. In the initial position of components 12, 14 poised for assembly illustrated in FIGS. 1 and 2, receiving bight datum 50 and boss member datum 52 are separated by a distance δ and receiving bight is situated at a starting line 34.

Figure 3:
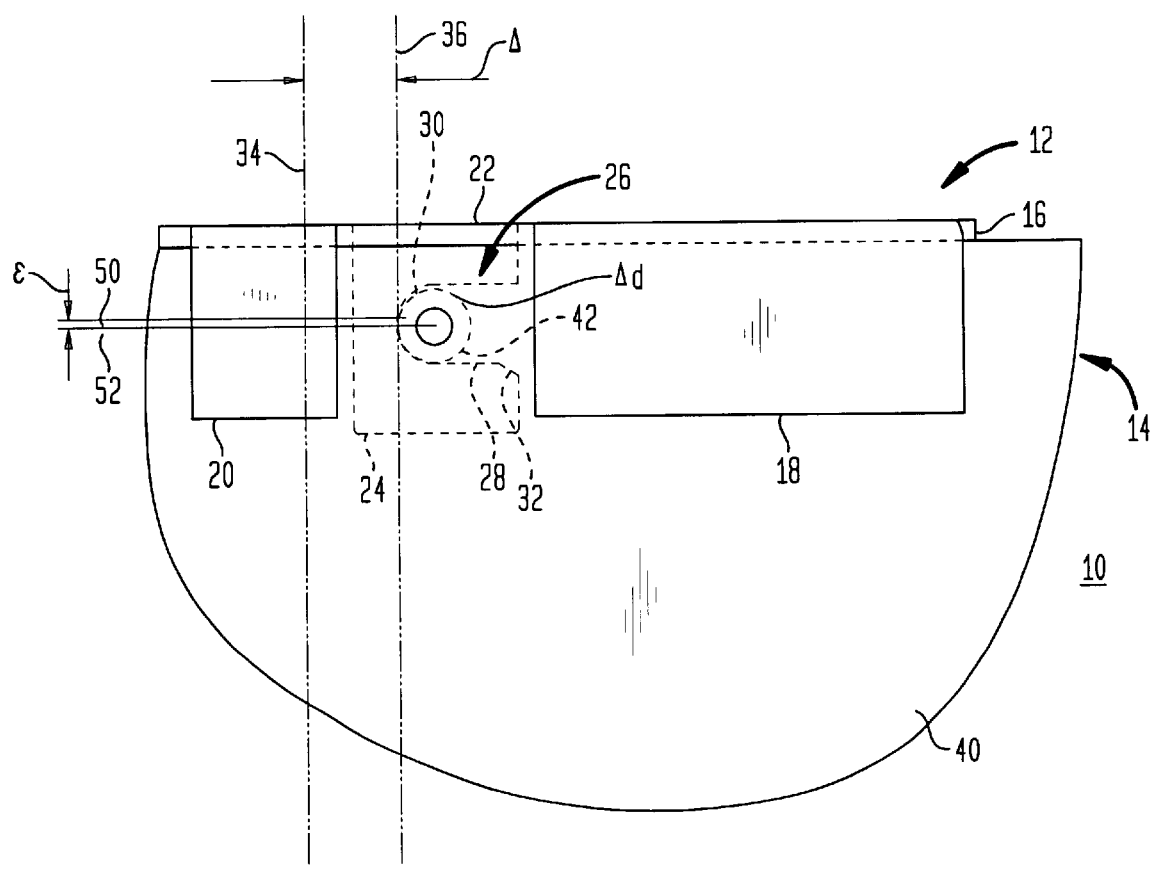
FIG. 3 is a front view of a first component and a second component in an installed orientation.

FIG. 3 is a front view of a first component and a second component in an installed orientation. In FIG. 3, system 10 for fixing first component 12 with second component 14 is illustrated in an installed orientation. First component 12 has a generally planar expanse 16 (viewed edge-on in FIG. 3) with depending skirt segments 18, 20. First component 12 further includes a spring arm 22 depending from planar expanse 16. Spring arm 22 terminates in a latch member 24. Latch member 24 is generally contained in an engaging plane (substantially parallel with the plane of FIG. 3) and presents an engagement structure 26. Engagement structure 26 includes a receiving rail 28 and a receiving bight 30.

Second component 14 includes a substantially planar expanse 40 that is preferably generally perpendicular with planar expanse 16 of first component 12. This substantially perpendicular arrangement of planar expanses 16, 40 is a preferred embodiment presented in FIG. 3 for illustrative purposes and is not intended as a limiting feature of the present invention. A protrusion or boss member 42 is formed in planar expanse 40. Boss member 42 extends from planar expanse 40 and is oriented about a boss axis (preferably perpendicular to the plane of FIG. 3).

First component 12 and second component 14 are illustrated in FIG. 3 in an installed orientation having been urged together from the initial position illustrated in FIGS. 1 and 2. Thus planar expanse 40 is in substantially abutting relationship with planar expanse 16, substantially perpendicular with planar expanse 16 and lightly abutting with skirt segments 18, 20 with boss member 42 extending from planar expanse 40 in a direction away from skirt segments 18, 20. Engagement structure 26 is situated next to planar expanse 40 on the side of planar expanse 40 opposite from the side of planar expanse 40 against which skirt segments 18, 20 abut. Engagement structure 26 is in an installed or assembled relation with boss member 42; boss member 42 is received within receiving bight 30 resting on receiving rail 28 after having ridden over ramp 32 when components 12, 14 were urged together from the initial position illustrated in FIGS. 1 and 2.

The preferred differences in bight diameter $d_1$ and boss diameter $d_2$ (discussed in connection with FIG. 1) are manifested in the installed orientation illustrated in FIG. 3 by a gap Δd between boss member 42 and receiving bight 30. Providing such a gap Δd permits easy insertion of boss member 42 within receiving bight 30 in a nestling relationship with receiving bight 30 when components 12, 14 are in the installed orientation illustrated in FIG. 3. Boss member 42 may be embodied in any rod-shaped configuration having but not limited to, any polygonal cross section or elliptical cross-section taken perpendicular to the boss axis.

Receiving bight 30 may be fashioned in any shape that receives boss member 42 in a generally nestling relationship. Receiving bight 30 is preferably symmetrical about receiving bight datum 50; boss member 42 is symmetrical about boss member datum 52 (boss member datum 52 intersects perpendicularly with the boss axis; better seen in FIG. 4). In the installed orientation of components 12, 14 illustrated in FIG. 3, receiving bight datum 50 and boss member datum 52 are separated by a distance ε that is less than distance δ by which receiving bight datum 50 and boss member datum 52 were separated in the initial position illustrated in FIGS. 1 and 2. Preferably distance ε is greater than zero in order to ensure that boss member 42 bears against receiving rail 28 against spring force imparted to spring arm 22 by displacing spring arm 22 from its initial position (FIGS. 1 and 2) to the installed orientation (FIG. 3), thus helping to keep components 12, 14 in the installed orientation illustrated in FIG. 3. During the urging together of components 12, 14 in achieving the installed orientation illustrated in FIG. 3 from the initial position illustrated in FIGS. 1 and 2, receiving bight has moved from starting line 34 to installed line 36, a displacement of a distance Δ.

Figure 4:
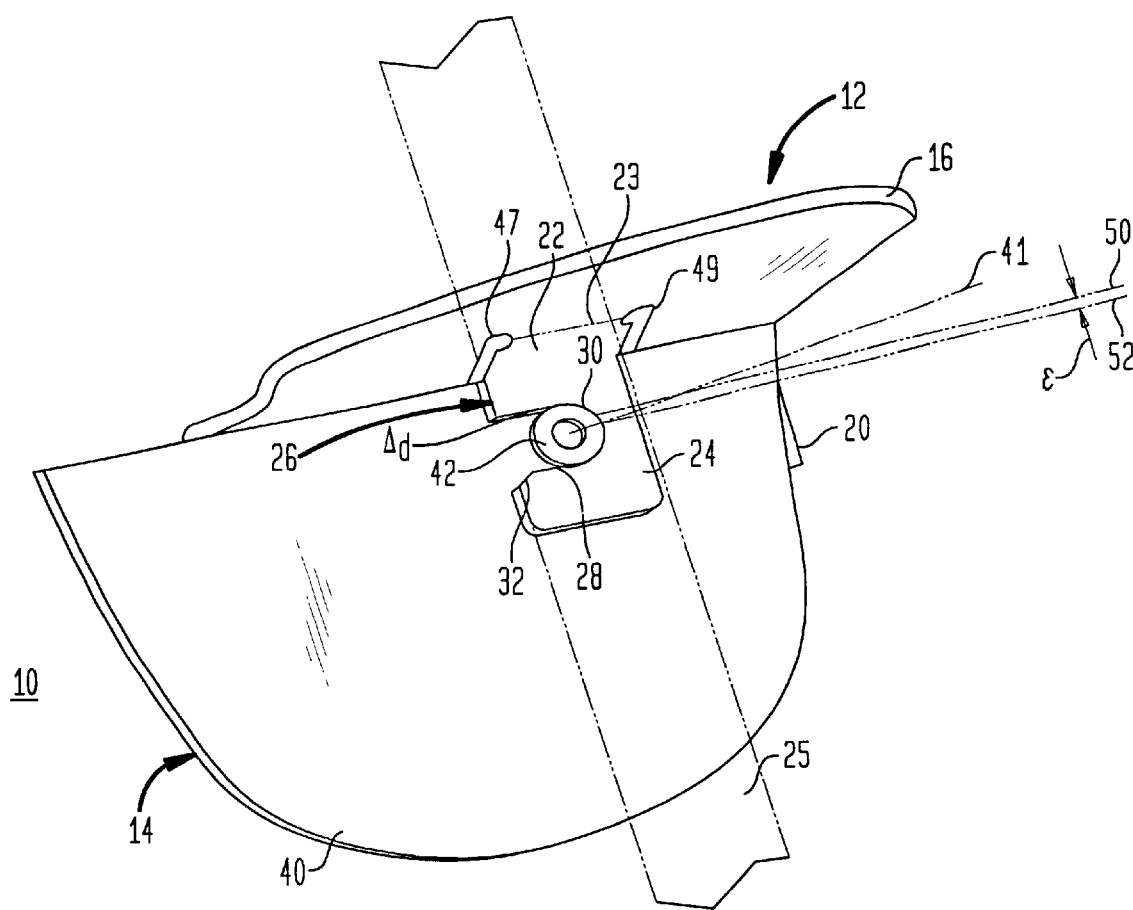
FIG. 4 perspective rear view of a first component and a second component in an installed orientation.

FIG. 4 is a perspective rear view of a first component and a second component in an installed orientation. In FIG. 4, system 10 for fixing a first component 12 with a second component 14 is illustrated in an installed orientation. First component 12 has a generally planar expanse 16 with depending skirt segments 18, 20 (depending skirt segments 18, 20 are not visible in FIG. 4). First component 12 further includes spring arm 22 depending from planar expanse 16. Spring arm 22 terminates in latch member 24. Latch member 24 is generally contained in an engaging plane 25, and presents an engagement structure 26 that includes receiving rail 28 and receiving bight 30.

Second component 14 includes substantially planar expanse 40 that is situated generally perpendicular with planar expanse 16 of first component 12. This substantially perpendicular arrangement of planar expanses 16, 40 is a preferred embodiment presented in FIG. 4 for illustrative purposes and is not intended as a limiting feature of the present invention. Boss member 42 is formed in planar expanse 40 and extends from planar expanse 40 oriented about a boss axis 41.

First component 12 and second component 14 are illustrated in FIG. 4 in an installed orientation having been urged together from the initial position illustrated in FIGS. 1 and 2. Thus planar expanse 40 is in substantially abutting relationship with planar expanse 16, substantially perpendicular with planar expanse 16, and lightly abutting with skirt segments 18, 20 with boss member 42 extending from planar expanse 40 in a direction away from skirt segments 18, 20 (skirt segments 18, 20 are not visible in FIG. 4). Engagement structure 26 is situated next to planar expanse 40 on the side of planar expanse 40 opposite from the side of planar expanse 40 against which skirt segments 18, 20 abut. Engagement structure 26 is in an installed or assembled relation with boss member 42; boss member 42 is received within receiving bight 30 resting on receiving rail 38 after having ridden over receiving ramp 32 when components 12, 14 were urged together from the initial position illustrated in FIGS. 1 and 2.

The preferred differences in bight diameter $d_1$ and boss diameter $d_2$ (discussed in connection with FIG. 1) are manifested in the installed orientation illustrated in FIG. 4 by a gap $\Delta d$ between boss member 42 and receiving bight 30. Providing such a gap $\Delta d$ permits easy insertion of boss member 42 within receiving bight 30 in a nestling relationship with receiving bight 30 when components 12, 14 are in the installed orientation illustrated in FIG. 4. Boss member 42 may be embodied in any rod-shaped configuration having but not limited to any polygonal cross section or elliptical cross-section taken perpendicular to boss axis 41.

Receiving bight 30 may be fashioned in any shape that receives boss member 42 in a generally nestling relationship. Receiving bight 30 is preferably symmetrical about receiving bight datum 50; boss member 42 is symmetrical about boss member datum 52. Boss member datum 52 intersects perpendicularly with boss axis 41. In the installed orientation of components 12, 14 illustrated in FIG. 4 receiving bight datum 50 and boss member datum 52 are separated by a distance $\epsilon$ that is less than distance $\delta$ by which receiving bight datum 50 and boss member datum 52 were separated in the initial position illustrated in FIGS. 1 and 2. Preferably distance $\epsilon$ is greater than zero in order to ensure that boss member 42 bears against receiving rail 28 against spring pressure imparted to spring arm 22 by displacing spring arm 22 from its initial position (FIGS. 1 and 2) to the installed orientation (FIG. 4) thus helping to keep components 12, 14 in the installed orientation illustrated in FIG. 4. Displacement of spring arm 22 from its initial position to the installed orientation illustrated in FIG. 4 is manifested in bending of spring arm 22 about a bend axis 23 preferably located substantially where spring arm 22 depends from planar expanse 16. Bend relief structures 47, 49 may be provided to define the desired location of bend axis 23. Alternatively, bend axis 23 may be located at any position along spring are 22 between the position indicated in FIG. 4 and engagement structure 26.

Figure 5:
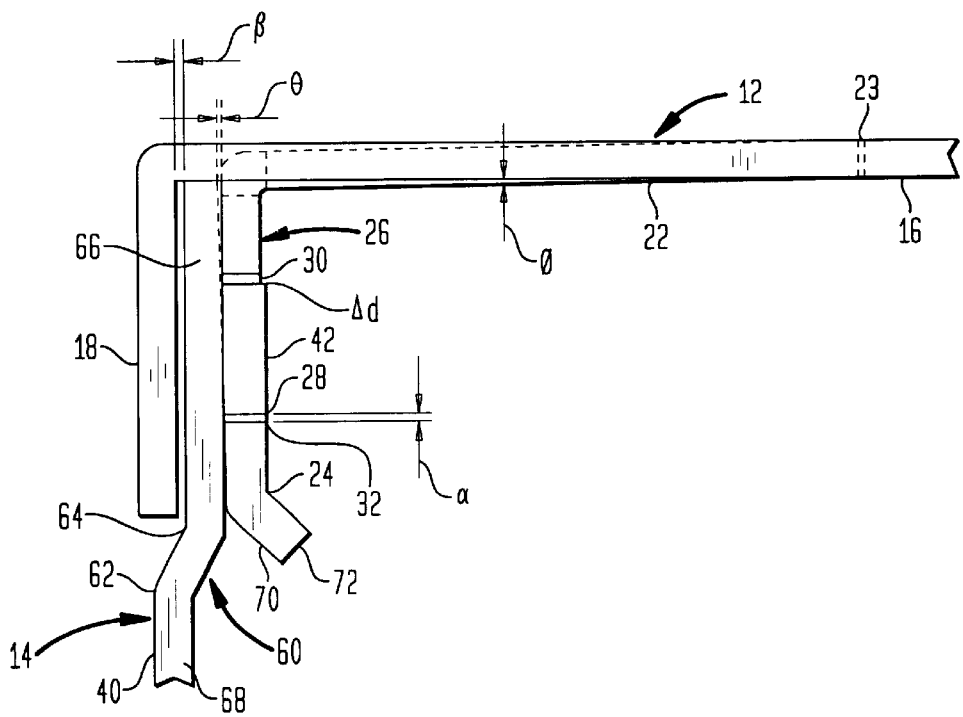
FIG. 5 is a drawing of the preferred embodiment of a first component and a second component in an installed orientation showing details of the boss member and latch member.

FIG. 5 is a drawing of the preferred embodiment of a first component and a second component in an installed orientation showing details of the boss member and latch member. In FIG. 5, first component 12 has a generally planar expanse 16 with a depending skirt segment 18. First component 12 further includes spring arm 22 depending from planar expanse 16 at a bend line 23. Spring arm 22 terminates in latch member 24. Latch member 24 presents engagement structure 26 that includes receiving rail 28 and receiving bight 30.

Second component 14 includes a planar expanse establishing a wall 40 that is situated generally perpendicular with planar expanse 16 of first component 12. This substantially perpendicular arrangement of planar expanse 16 and wall 40 is a preferred embodiment presented in FIG. 5 for illustrative purposes and is not intended as a limiting feature of the present invention. Boss member 42 is formed in wall 40 and extends from wall 40.

First component 12 and second component 14 are illustrated in FIG. 5 in an installed orientation having been urged together from the initial position similar to the initial position illustrated in FIGS. 1 and 2. Thus wall 40 is in substantially abutting relationship with planar expanse 16, substantially perpendicular with planar expanse 16. In the installed orientation illustrated in FIG. 5, wall 40 is installed in spaced relation with skirt segment 18 between skirt segment 18 and engagement structure 26. Wall 40 is spaced a distance $\beta$ from skirt segment 18. Boss member 42 extends from wall 40 in a direction away from skirt segment 18. Engagement structure 26 is an abutting relation with wall 40 on the side of planar expanse 40 opposite from the side of wall 40 at which skirt segment 18 is located.

A further refinement of the present invention is illustrated in FIG. 5 in a deviation 60 in wall 40. Deviation 60 includes a first bend 62 and a second bend 64. First bend 62 and second bend 64 cooperate to situate a first wall portion 66 of wall 40 appropriately for installation between skirt segment 18 and engagement structure 26, as described above, while also situating a second wall portion 68 below skirt segment 18 in a substantially coplanar relation with skirt segment 18. Such a coplanar arrangement between skirt segment 18 and second wall portion 68 facilitates employment of the present invention in affixing a lid with an associated bin to form a product enclosure that is substantially polyhedral. Such a coplanar arrangement between skirt segment 18 and second wall portion 68 of wall 40 is particularly useful in establishing enclosures having a right polyhedral shape appropriate for engagement within a provided receiving structure, such as a slot or a rack or similar structure. One example of such a receiving structure is a channel bank in a telecommunication switch.

Engagement structure 26 displaces first wall portion 66 in the installed orientation illustrated in FIG. 5 by an displacement angle of $\theta$, thereby increasing frictional interference between engagement structure 26 and wall 40 to better fix components 12, 14 in the installed orientation. Separation distance $\beta$ between wall 40 and skirt segment 18 is proportioned to accommodate deflection, or displacement of wall 40 by engagement structure 26. Engagement structure 26 is in an installed or assembled relation with boss member 42;

boss member 42 is received within receiving bight 30 resting on receiving rail 38 after having ridden over receiving ramp 32 when components 12, 14 were urged together from the initial position illustrated in FIGS. 1 and 2. Receiving ramp 32 has a ramp height of α.

The preferred differences in bight diameter $d_1$ and boss diameter $d_2$ (discussed in connection with FIG. 1) are manifested in the installed orientation illustrated in FIG. 5 by a gap Δd between boss member 42 and receiving bight 30. Providing such a gap Δd permits easy insertion of boss member 42 within receiving bight 30 in a nestling relationship with receiving bight 30 when components 12, 14 are in the installed orientation illustrated in FIG. 5.

Displacement of spring arm 22 from its initial position to the installed orientation illustrated in FIG. 5 is manifested in bending of spring arm 22 about a bend axis 23 preferably located substantially where spring arm 22 depends from planar expanse 16. Bend relief structures 47, 49 may be provided to define the desired location of bend axis 23. Alternatively, bend axis 23 may be located at any position along spring are 22 between the position indicated in FIG. 5 and engagement structure 26.

In an at-rest position before flexing during urging components 12, 14 together to effect the installed orientation illustrated in FIG. 5, components 12, 14 are oriented as illustrated in FIGS. 1 and 2; spring arm 22 is substantially coplanar with planar expanse 16. When components 12, 14 are in the installed orientation illustrated in FIG. 5, spring arm 22 has been flexed or bent about bend line 23 and is situated at an angular displacement of Φ from the initial position coplanar with planar expanse 16.

The embodiment of the present invention illustrated in FIG. 5 also provides a flare structure 70 in engagement structure 26. Flare structure 70 facilitates positioning of component 12 with respect to component 14 to achieve the initial position illustrated in FIGS. 1 and 2 in that it guides first wall portion 66 to its desired location intermediate skirt segment 18 and engagement structure 26 while arranging components 12, 14 in the initial position and avoids snagging interference by end 72 with first wall portion 66 during such arranging.

Figure 6:
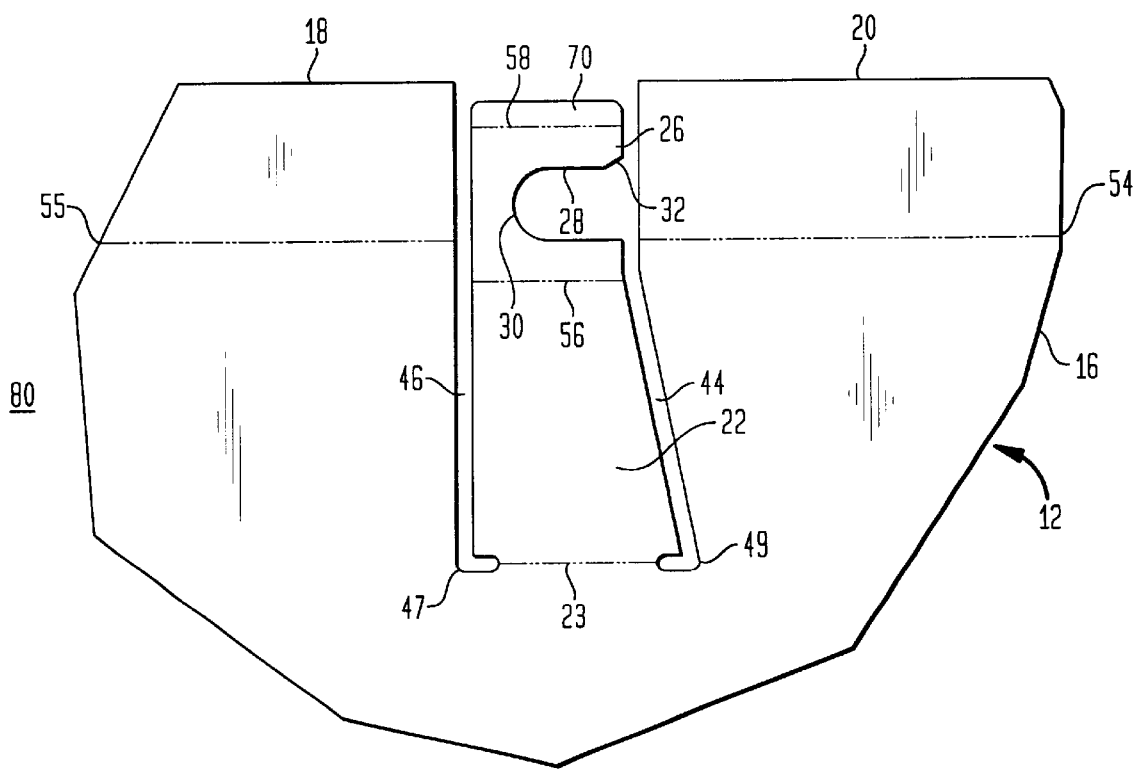
FIG. 6 is a plan view of a blank for a component illustrating the layout for forming a latch member.

FIG. 6 is a plan view of a blank for a component illustrating the layout for forming a latch member. In FIG. 6, a component 12 is formed from a blank 80 that includes a planar expanse 16. Slots 44, 46 are stamped or cut or otherwise formed by removing material from blank 80. Slots 44, 46 define a spring arm 22. Displacement of spring arm 22 from its initial position to an installed position (e.g. FIGS. 4 and 5) is manifested in bending of spring arm 22 about a bend axis 23 preferably located substantially where spring arm 22 depends from planar expanse 16. Bend relief structures 47, 49 may be provided to define the desired location of bend axis 23. Alternatively, bend axis 23 may be located at any position along spring are 22 between the position indicated in FIG. 6 and engagement structure 26.

More material is removed from spring arm 22 to establish a receiving bight 30, a receiving ramp 28 and a ramp 32. A bend line 56 indicates where blank 80 may be bent in an amount generally on the order of 90 degrees to establish an engagement structure 26 depending from spring arm 22. A further bend at a bend line 58 may be effected to establish a flare structure 70 (FIG. 5) if desired. A skirt segment 20 may be established by bending blank 80 at a bend line 54; a skirt segment 18 may be established by bending blank 80 at a bend line 55.

Figure 7:
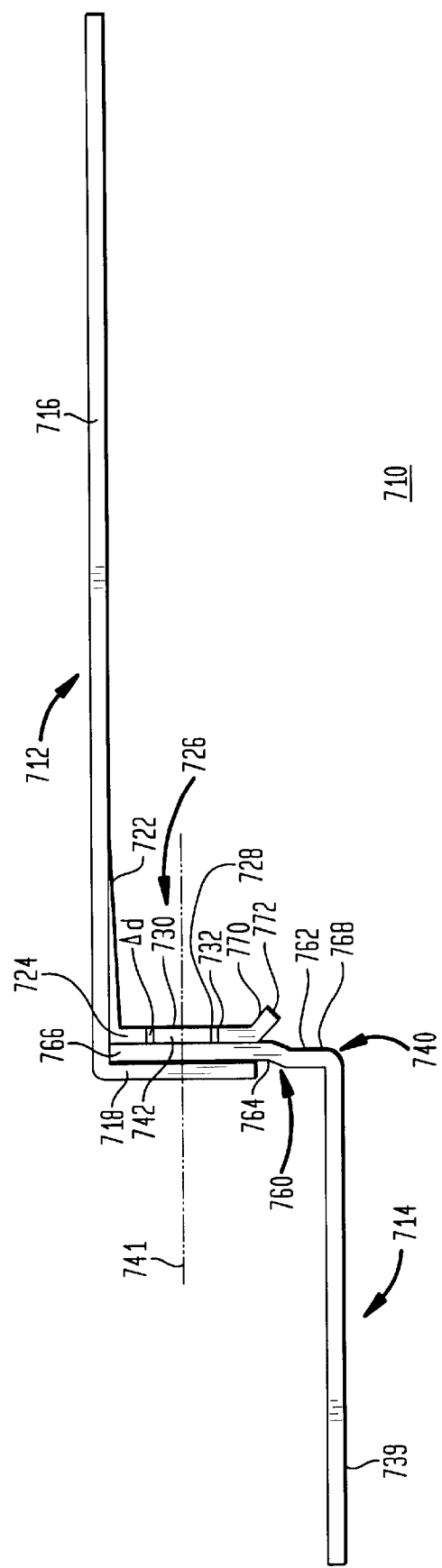
FIG. 7 is a side view of an alternate embodiment of the system of the present invention.

FIG. 7 is a side view of an alternate embodiment of the system of the present invention. In FIG. 7, a system 710 for fixing a first component 712 with a second component 714 is illustrated. First component 712 has a generally planar expanse 716 with a depending skirt segment 718 and includes a spring arm 722 depending from planar expanse 716. Spring arm 722 terminates in a latch member 724. Latch member 724 presents an engagement structure 726 that includes a receiving rail 728 and a receiving bight 730.

Second component 714 includes a substantially planar expanse 739 that is situated generally parallel with planar expanse 716 of first component 712. Planar expanse 739 presents a wall 740 that is situated generally perpendicular with planar expanse 716 of first component 712. This substantially perpendicular arrangement of planar expanse 716 and wall 740 is a preferred embodiment presented in FIG. 7 for illustrative purposes and is not intended as a limiting feature of the present invention. A boss member 742 is integrally formed with wall 740 and extends from wall 740 oriented about a boss axis 741.

First component 712 and second component 714 are illustrated in FIG. 7 in an installed orientation having been urged together from the initial position similar to the initial position illustrated in FIGS. 1 and 2. Thus, wall 740 is in substantially abutting relationship with planar expanse 716, substantially perpendicular with planar expanse 716. In the installed orientation illustrated in FIG. 7, wall 740 is installed in spaced relation with skirt segment 718 between skirt segment 718 and engagement structure 726. Wall 740 is in spaced relation from skirt segment 718 (similar to the structure described in connection with FIG. 5). Boss member 742 extends from wall 740 in a direction away from skirt segment 718. Engagement structure 726 is an abutting relation with wall 740 on the side of wall 740 opposite from the side of wall 740 at which skirt segment 718 is located.

Wall 740 has a deviation 760 that includes a first bend 762 and a second bend 764. First bend 762 and second bend 764 cooperate to situate a first wall portion 766 of wall 740 appropriately for installation between skirt segment 718 and engagement structure 726, as described above, while also situating a second wall portion 768 below skirt segment 718 in a substantially coplanar relation with skirt segment 718.

Engagement structure 726 is in an installed or assembled relation with boss member 742; boss member 742 is received within receiving bight 730 resting on receiving rail 738 after having ridden over receiving ramp 732 when components 712, 714 were urged together from the initial position illustrated in FIGS. 1 and 2.

The preferred differences in bight diameter $d_1$ and boss diameter $d_2$ (discussed in connection with FIG. 1) are manifested in the installed orientation illustrated in FIG. 7 by a gap Δd between boss member 742 and receiving bight 730. Providing such a gap Δd permits easy insertion of boss member 742 within receiving bight 730 in a nestling relationship with receiving bight 730 when components 712, 714 are in the installed orientation illustrated in FIG. 7.

Displacement of spring arm 722 from its initial position to the installed orientation illustrated in FIG. 7 is manifested in bending of spring arm 722 about a bend axis (not shown in detail in FIG. 7) preferably located substantially where spring arm 22 depends from planar expanse 716. Alternatively the bend axis may be located at any position along spring are 722 between the position indicated in FIG. 7 and engagement structure 726.

In an at-rest position before flexing during urging components 712, 714 together to effect the installed orientation illustrated in FIG. 7, components 712, 714 are oriented generally as illustrated in FIGS. 1 and 2; spring arm 722 is substantially coplanar with planar expanse 716. When components 712, 714 are in the installed orientation illustrated in FIG. 7, spring arm 722 has been flexed or bent about a bend line (not shown in FIG. 7) and is situated at an angular displacement from the initial position coplanar with planar expanse 716.

The embodiment of the present invention illustrated in FIG. 7 also provides a flare structure 770 in engagement structure 726. Flare structure 770 facilitates positioning of component 712 with respect to component 714 to achieve the initial position illustrated in FIGS. 1 and 2 in that it guides first wall portion 766 to its desired location intermediate skirt segment 718 and engagement structure 726 while arranging components 712, 714 in the initial position and avoids snagging interference by end 772 with first wall portion 766 during such arranging.

Figure 8:
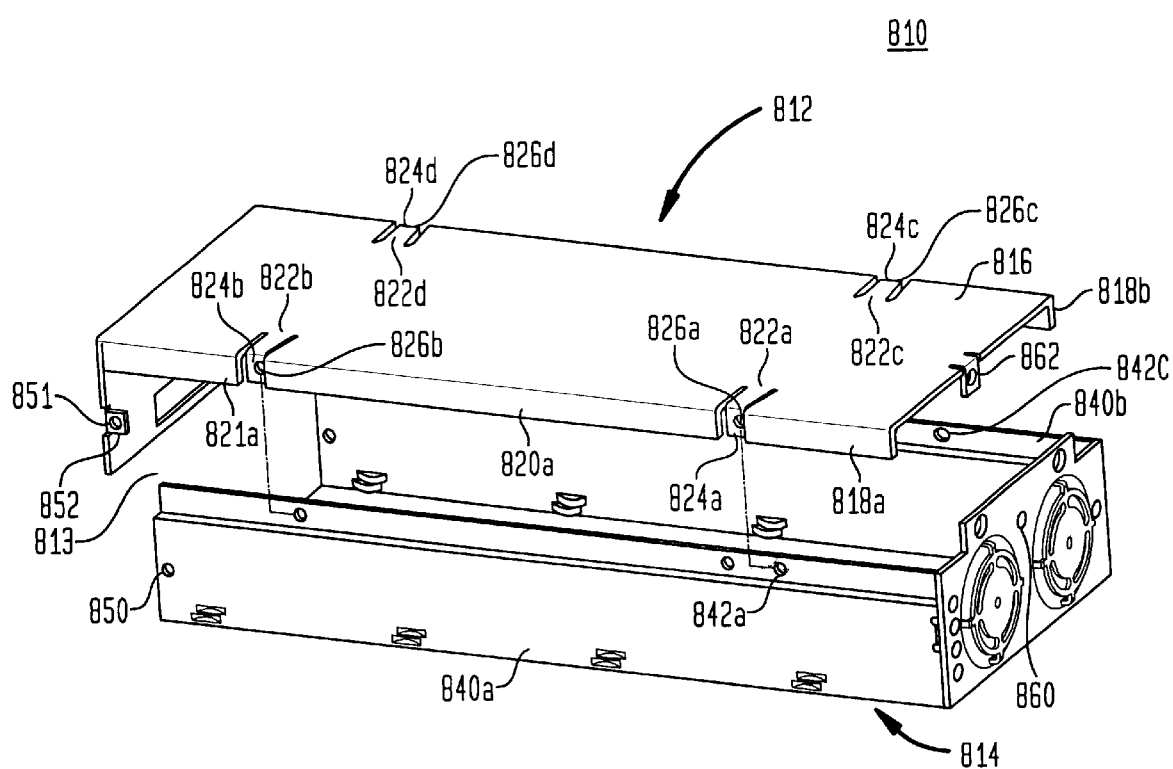
FIG. 8 an exploded view of a preferred embodiment of the system of the present invention in a representative product.

FIG. 8 is an exploded view of a preferred embodiment of the system of the present invention in a representative product. In FIG. 8, an enclosure 810 includes a lid component 812 and a box component 814. Lid component 810 includes a planar expanse 816 and a plurality of skirt segments 818a, 820a, 821a, 818b (additional skirt segments are arranged symmetrically with skirt segments 820a, 821a but are not visible in FIG. 8). Skirt segments 818a, 820a, 821a are substantially coplanar; skirt segments 818a and other skirt segments on the same side of planar expanse 816 not visible in FIG. 8 are substantially coplanar.

Lid component 812 further includes a plurality of spring arms 822a, 822b, 822c, 822d depending from planar expanse 816. Each respective spring arm 822a, 822b, 822c, 822d terminates in a respective latch member 824a, 824b, 824c, 824d. Each respective latch member 824a, 824b, 824c, 824d is generally contained in a respective engaging plane substantially parallel with neighboring skirt segments and situated toward planar expanse 816 from neighboring skirt segments. Thus latch members 824a, 824b are contained in a common engaging plane substantially parallel with skirt segments 818a, 820a, 821a and latch members 824c, 824d are contained in a common engaging plane substantially parallel with skirt segment 818b and other skirt segments on the same side of planar expanse 816 not visible in FIG. 8. Each respective latch member 824a, 824b, 824c, 824d, presents an engagement structure 824a, 824b, 824c, 824d (engagement structures 826c, 826d are not visible in FIG. 8). Each engagement structure 824a, 824b, 824c, 824d includes a receiving rail ramp and receiving bight configured generally as described in connection with FIGS. 1 through 4. Details of those engagement structure 824a, 824b, 824c, 824d are not repeated here in order to avoid prolixity.

Box component 814 includes substantially planar expanses embodied as walls 840a, 840b of box component 814. Walls 840a, 840b are generally perpendicular with planar expanse 816 of lid component 812. A plurality of protrusions or boss members 842a, 842b, 842c (and another protrusion or boss member not visible in FIG. 8 that is configured and located for engagement with engagement structure 826d) are formed in walls 840a, 840b. Each respective boss member 842a, 842b, 842c (and the boss member situated for engagement with engagement structure 826d) extends from one wall 840a, 840b in a direction inward toward the interior 813 of box component 814 and is oriented perpendicular to the plane of its respective wall 840a, 840b.

Lid component 812 and box component 814 are illustrated in FIG. 8 in an exploded view poised for assembly to an initial position. Thus, lid component 812 is oriented to be vertically moved to an initial engagement with box component 814 to situate walls 840a, 840b and planar expanse 816 in substantially abutting perpendicular relationship and lightly abutting with skirt segments 818a, 820a, 821a, 818b and other skirt segments not visible in FIG. 8. The arrangement is similar to the initial position described in connection with FIGS. 1 and 2.

In this initial position boss members 842a, 842b, 842c (and the boss member situated for engagement with engagement structure 826d) extend from walls 840a, 840b toward interior 813 of box component 814. Engagement structures 826a, 826b, 826c, 826d are situated next to planar expanses 840a, 840b in interior 813 of box component 814 in close spaced relation with and presenting a rail (similar to rail 32 in FIGS. 1 and 2) to respective boss members 842a, 842b, 842c (and the boss member situated for engagement with engagement structure 826d).

In the initial position described in connection with FIG. 8, after lid component 812 is moved vertically into position with box component 814, components 812, 814 are poised for sliding urging together to effect engagement between respective engagement structures 826a, 826b, 826c, 826d and boss members 842a, 842b, 842c (and the boss member situated for engagement with engagement structure 826d) in an installed orientation (illustrated in FIG. 9).

An aperture 851 in a tab 852 that is alignable in an installed orientation with a dimple 850 may be provided to establish a firmer engagement between lid component 812 and box component 814, if desired. An aperture 860 that is alignable in an installed orientation with a tapped tab 862 are provided to accommodate insertion of a threaded fastener such as a screw to establish a firmer engagement between lid component 812 and box component 814, if desired.

Figure 9:
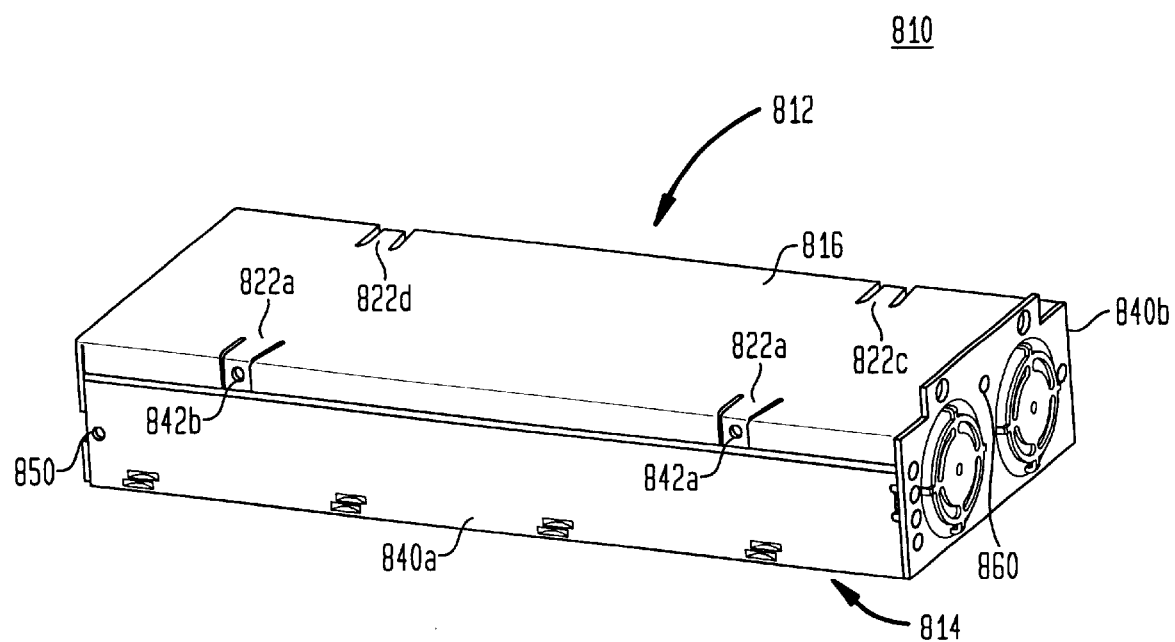
FIG. 9 is an assembled view of a preferred embodiment of the system of the present invention in a representative product.

FIG. 9 is an assembled view of a preferred embodiment of the system of the present invention in a representative product. In FIG. 9, system 810 is in an installed orientation with lid component 812 fixedly engaged with box component 814. Visible in FIG. 9 are spring arms 822a, 822b, 822c, 822d. Boss members 842a, 842b are visible in their engaged orientation with engagement structures not visible in FIG. 9 because they are inside of wall 840a. Spring arms 822a, 822b, 822c, 822d are tensioned in their installed orientation (in the manner described in connection with FIGS. 3 and 4) to maintain lid component 812 and box component 814 in the installed orientation. An aperture 851 in a tab 852 (not visible in FIG. 9) receives dimple 850 to establish a firmer engagement between lid component 812 and box component 814. Screws may be installed, such as through an aperture 860 to a tapped tab 862 (FIG. 8) to establish a firmer engagement between lid component 812 and box component 814, if desired.

Figure 10:
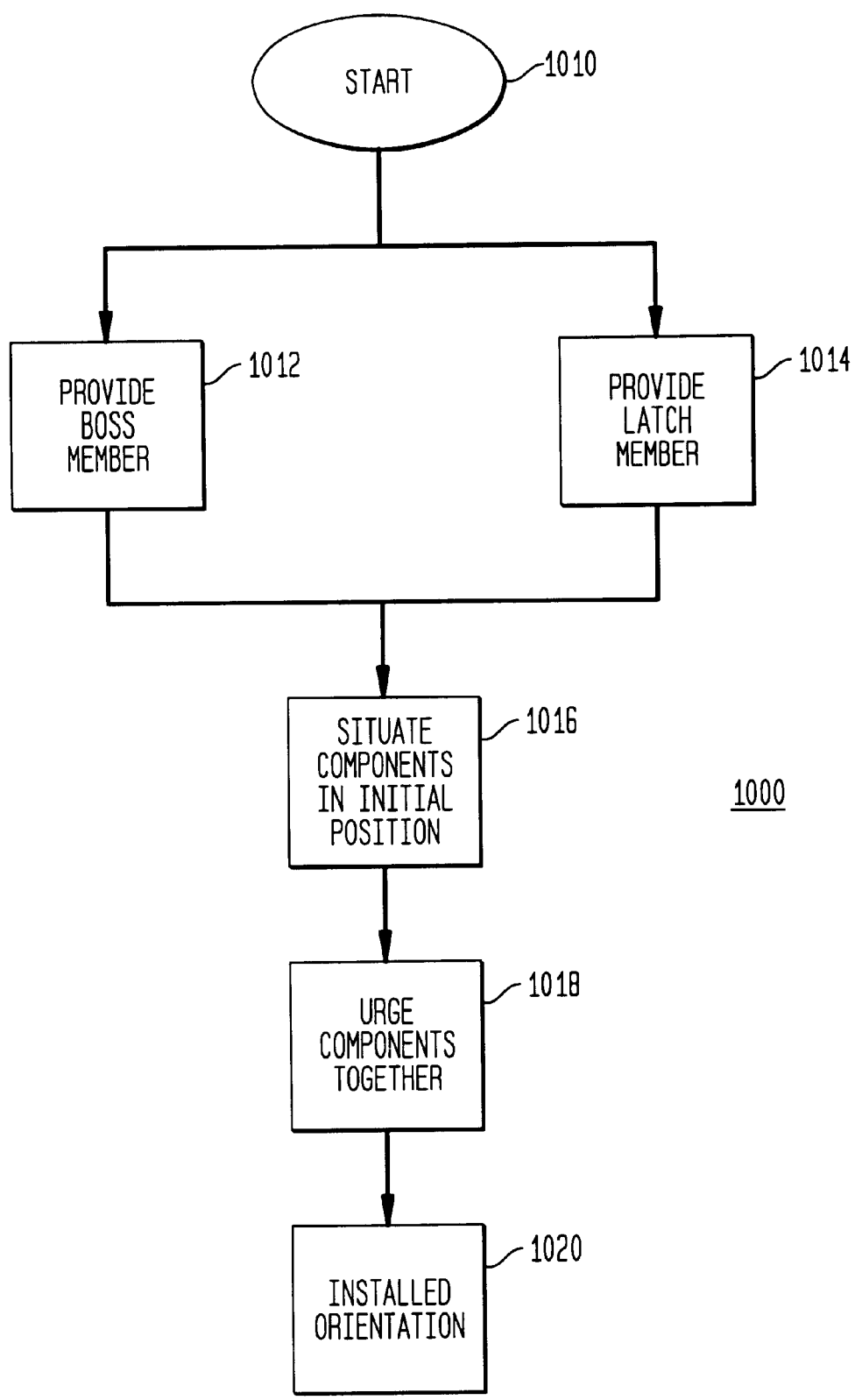
FIG 10 is a schematic flow diagram illustrating the method of the present invention.

FIG. 10 is a schematic flow diagram illustrating the method of the present invention. In FIG. 10, a method 1000 for substantially fixing a first component with a second component begins with a start locus 1010. The method proceeds from start locus 1010 to the step of providing, in no particular order, a boss member integrally formed from the first component as indicated by a block 1012, and a latch member as indicated by a block 1014.

The boss member is generally oriented about a boss axis. The boss axis is generally perpendicular with the first component. The latch member is integrally formed from the second component and depends from the second component in a spring arm. The spring arm facilitates movement of the latch member generally in an engaging plane. The spring arm exerts a spring force urging the latch member toward a first position when the latch member is displaced to a second position different from the first position. The latch member is generally oriented about a latch axis in the engaging plane.

The method continues with the step of situating the first component and the second component substantially adjacent in an initial position, as indicated by a block 1016. When the components are in the initial position they are poised for assembly with the engaging plane generally perpendicular with the boss axis. The latch axis and the boss axis are displaced a first distance when the first component and the second component are in the initial position.

The method continues with the further step of urging at least one of the boss member and the latch member toward the other member of the boss member and the latch member as indicated by a block 1018. The urging together of the components engages the boss member and the latch member in an installed orientation, as indicated by a block 1020. The latch axis and the boss axis are displaced a second distance less than the first distance when the boss member and the latch member are engaged in the installed orientation to establish the fixing with the latch member held in an installed position displaced from the first position by the boss member bearing against the latch member with the engaging plane crossing the boss axis.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A system for substantially fixing a plurality of components; the system comprising:
    (a) a first component of said plurality of components; said first component including a first wall; said first wall being generally planar;
    (b) a second component of said plurality of components; said second component including a second wall; said second wall being generally planar;
    (c) a boss member; said boss member being integrally formed from said first wall; said boss member extending from said first wall and being generally oriented about a boss member axis generally perpendicular with said first wall; and
    (d) a latch member; said latch member being integrally formed from said second component; said latch member depending from said second component in a flexible extension; said flexible extension facilitating movement of said latch member generally in an engaging plane; said engaging plane being generally parallel with said second wall and displaced from said second wall; said flexible extension exerting a spring force urging said latch member toward a first position when said latch member is displaced to a second position different from said first position; said latch member being generally oriented in said engaging plane about a latch member axis generally perpendicular with said engaging plane; said latch member including an engagement structure having a receiving rail and a receiving bight;

said latch member being in said first position when said first wall and said second wall are substantially adjacently situated in an initial position poised for assembly with said first wall between said second wall and said latch member; said latch member axis and said boss member axis being separated a first distance when said first component and said second component are in said initial position; said latch member axis and said boss member axis being separated a second distance less than said first distance when at least one of said boss member and said latch member is urged toward the other member of said boss member and said latch member to engage said boss member and said latch member in an installed orientation to establish said fixing with said latch member held in an installed position displaced from said first position by said boss member bearing against said latch member with said engaging plane crossing said boss member; said receiving rail slidingly guiding said boss member to said receiving bight during said urging from said initial position to said installed orientation.

2. The system for substantially fixing a first component with a second component as recited in claim 1 wherein said receiving rail has a transition structure for facilitating said slidingly guiding said boss member to said receiving bight.

3. The system for substantially fixing a first component with a second component as recited in claim 2 wherein said transition structure is a ramp; said ramp facing said boss member when said boss member and said latch member are in said initial position.

4. A system for substantially fixing a plurality of component; the system comprising:
    (a) a first component of said plurality of components; said first component including a first wall; said first wall being generally planar;
    (b) a second component of said plurality of components; said second component including a second wall; said second wall being generally planar;
    (c) a boss member; said boss member being integrally formed from said first wall; said boss member extending from said first wall and being generally oriented about a boss member axis; said boss member axis being generally perpendicular with said first wall;
    (d) a latch member; said latch member being integrally formed from said second component; said latch member depending from said second component in a spring arm; said spring arm facilitating movement of said latch member generally in an engaging plane; said engaging plane being generally parallel with said second wall and displaced from said second wall; said spring arm exerting a spring force urging said latch member toward a first position when said latch member is displaced to a second position different from said first position; said latch member being generally oriented in said engaging plane about a latch member axis generally perpendicular with said engaging plane; said latch member including an engagement structure having a receiving rail and a receiving bight;

said latch member being in said first position when said first wall and said second wall are substantially adjacently situated in an initial position poised for assembly with said first wall between said second wall and said latch member and with said engaging plane generally perpendicular with said boss member axis; said latch member axis and said boss member axis being separated a first distance when said first component and said second component are in said initial position; said latch member axis and said boss member axis being separated a second distance less than said first distance when at least one of said boss member and said latch member is urged toward the other member of said boss member and said latch member to engage said boss member and said latch member in an installed orientation to establish said fixing with said latch member held in an installed position displaced from said first position by said boss member bearing against said latch member with said engaging plane crossing said boss member; said receiving rail slidingly guiding said boss member to said receiving bight during said urging from said initial position to said installed orientation.

5. The system for substantially fixing a first component with a second component as recited in claim 4 wherein said receiving rail has a transition structure for facilitating said slidingly guiding said boss member to said receiving bight.

6. The system for substantially fixing a first component with a second component as recited in claim 5 wherein said transition structure is a ramp; said ramp facing said boss member when said boss member and said latch member are in said initial position.

7. The system for substantially fixing a first component with a second component as recited in any of claim 4, 5 or 6 wherein said first component and said second component are generally perpendicular in said initial position and in said installed orientation.

8. A method for substantially fixing a plurality of components; the method comprising the steps of:

(a) providing, in no particular order:
  (1) a first component of said plurality of components; said first component including a first wall; said first wall being generally planar;
  (2) a second component of said plurality of components; said second component including a second wall; said second wall being generally planar;
  (3) a boss member; said boss member being integrally formed from said first wall; said boss member extending from said first wall and being generally oriented about a boss member axis; said boss member axis being generally perpendicular with said first wall; and
  (4) a latch member; said latch member being integrally formed from said second component; said latch member depending from said second component in a spring arm; said spring arm facilitating movement of said latch member generally in an engaging plane; said engaging plane being generally parallel with said second wall and displaced from said second wall; said spring arm exerting a spring force urging said latch member toward a first position when said latch member is displaced to a second position different from said first position; said latch member being generally oriented in said engaging plane about a latch member axis generally perpendicular with said engaging plane; said latch member including an engagement structure having a receiving rail and a receiving bight;

(b) situating said first wall and said second wall substantially adjacent in an initial position poised for assembly with said first wall between said second wall and said latch member and with said engaging plane generally perpendicular with said boss member axis; said latch member axis and said boss member axis being separated a first distance when said first component and said second component are in said initial position; and (c) urging at least one of said boss member and said latch member toward the other member of said boss member and said latch member to engage said boss member and said latch member in an installed orientation; said latch member axis and said boss member axis being separated a second distance less than said first distance when said boss member and said latch member are engaged in said installed orientation to establish said fixing with said latch member held in an installed position displaced from said first position by said boss member bearing against said latch member with said engaging plane crossing said boss member; said receiving rail slidingly guiding said boss member to said receiving bight during said urging from said initial position to said installed orientation.

9. The method for substantially fixing a first component with a second component as recited in claim 8 wherein said receiving rail has a transition structure for facilitating said slidingly guiding said boss member to said receiving bight.

10. The method for substantially fixing a first component with a second component as recited in claim 9 wherein said transition structure is a ramp; said ramp facing said boss member when said boss member and said latch member are in said initial position.

* * * * *